(12) United States Patent  (10) Patent No.: US 9,083,293 B2
Chien et al.  (45) Date of Patent: Jul. 14, 2015

(54) SIGNAL TRANSCEIVER

(75) Inventors: George Chien, Saratoga, CA (US);
Chia-Hsin Wu, New Taipei (TW);
Tsung-Ming Chen, Hsinchu County
(TW); Yi-An Li, Taichung (TW)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 346 days.

(21) Appl. No.: 13/472,518

(22) Filed: May 16, 2012

(65) Prior Publication Data

US 2012/0295556 A1   Nov. 22, 2012

Related U.S. Application Data

(60) Provisional application No. 61/487,775, filed on May 19, 2011.

(51) Int. Cl.
  *H04B 1/44*   (2006.01)
  *H04B 1/46*   (2006.01)
  *H04B 1/28*   (2006.01)
  *H03F 3/24*   (2006.01)
  *H03F 1/56*   (2006.01)
  *H03F 3/45*   (2006.01)
  *H03F 3/72*   (2006.01)

(52) U.S. Cl.
  CPC .. *H03F 3/24* (2013.01); *H03F 1/56* (2013.01); *H03F 3/45475* (2013.01); *H03F 3/72* (2013.01); *H03F 2200/06* (2013.01); *H03F 2200/387* (2013.01); *H03F 2200/429* (2013.01); *H03F 2200/541* (2013.01); *H03F 2203/45616* (2013.01); *H03F 2203/7209* (2013.01); *H03F 2203/7221* (2013.01); *H03F 2203/7236* (2013.01)

(58) Field of Classification Search
  CPC .................................. H04B 1/48; H04B 1/581
  USPC ........ 455/78, 80, 123, 292, 552.1–553.1, 333
  See application file for complete search history.

(56) References Cited

U.S. PATENT DOCUMENTS

| | | | |
|---|---|---|---|
| 6,882,829 B2 | 4/2005 | Mostov | |
| 7,274,913 B2 | 9/2007 | Marholev | |
| 7,702,296 B2 | 4/2010 | Siu | |
| 7,865,149 B2 | 1/2011 | Han | |
| 7,920,833 B2 * | 4/2011 | Qiao et al. | 455/78 |
| 8,099,062 B1 * | 1/2012 | Terrovitis | 455/84 |
| 8,229,367 B2 * | 7/2012 | Chan et al. | 455/78 |

(Continued)

FOREIGN PATENT DOCUMENTS

CN          101527542 B      12/2011

OTHER PUBLICATIONS

Haitao Gan, S. Simon Wong, Radio Frequency Integrated Circuits (RFIC) Symposium, "Integrated Transformer Baluns for RF Low Noise and Power Amplifiers", Jun. 2006.

(Continued)

*Primary Examiner* — Simon Nguyen
(74) *Attorney, Agent, or Firm* — Winston Hsu; Scott Margo

(57) ABSTRACT

A signal transceiver includes a first power amplifier coupled to a chip output port of a chip; an impedance transforming circuit; a switching circuit arranged to selectively couple the chip output port to a first port of the impedance transforming circuit; and a receiving amplifier coupled to a second port of the impedance transforming circuit.

23 Claims, 10 Drawing Sheets

(56) References Cited

U.S. PATENT DOCUMENTS

| | | | |
|---|---|---|---|
| 8,232,850 B2* | 7/2012 | Rofougaran | 333/25 |
| 8,368,481 B2* | 2/2013 | Jin et al. | 333/25 |
| 8,472,894 B2* | 6/2013 | Wang et al. | 455/107 |
| 8,483,627 B2* | 7/2013 | Rajendran et al. | 455/78 |
| 8,494,455 B2* | 7/2013 | Chan | 455/73 |
| 8,626,084 B2* | 1/2014 | Chan et al. | 455/78 |
| 8,649,740 B2* | 2/2014 | Lin et al. | 455/83 |
| 8,712,342 B2* | 4/2014 | Maimon et al. | 455/78 |
| 2004/0253939 A1* | 12/2004 | Castaneda et al. | 455/341 |
| 2008/0279262 A1* | 11/2008 | Shanjani | 375/219 |
| 2008/0299913 A1* | 12/2008 | Han et al. | 455/83 |
| 2008/0299930 A1* | 12/2008 | Rofougaran et al. | 455/275 |
| 2009/0291645 A1 | 11/2009 | Chu | |
| 2010/0109798 A1* | 5/2010 | Chu | 333/124 |
| 2010/0201457 A1 | 8/2010 | Lee | |
| 2010/0202325 A1 | 8/2010 | Poulin | |
| 2010/0207703 A1 | 8/2010 | Dupuy | |
| 2010/0327969 A1 | 12/2010 | Jung | |
| 2011/0281527 A1* | 11/2011 | Chiang et al. | 455/73 |
| 2012/0295559 A1* | 11/2012 | Kwok et al. | 455/83 |

OTHER PUBLICATIONS

Haitao Gan, "On-chip transformer modeling, characterization, and applications in power and low noise amplifiers", Mar. 2006.

* cited by examiner

US 9,083,293 B2

SIGNAL TRANSCEIVER

CROSS REFERENCE TO RELATED APPLICATIONS

This application claims the benefit of U.S. Provisional Application No. 61/487,775, which was filed on 2011 May 19 and is included herein by reference.

BACKGROUND

The present invention relates to a signal transceiver, and more particularly to a signal transceiver having the characteristics of high linearity and low noise figure.

In a wireless communication system comprising a receiver and a transmitter, an external T/R (Transmitter/Receiver) switch is applied for implementing a Time-Division Duplex (TDD) mode since both the receiver and the transmitter share the same antenna. When the wireless communication system is under operation, the external T/R switch is controlled to switch between the receiver and the transmitter for coupling either the receiver or the transmitter to the antenna. According to one conventional wireless communication system, the external T/R switch is installed in series with the receiver instead of the transmitter. When the external T/R switch is turned ON (i.e. shorted) under the receiving mode, the external T/R switch should have the characteristics of low insertion loss, large input range, low distortion, and low die area, etc. When the external T/R switch is turned OFF (i.e. open) under the transmitting mode, the external T/R switch should have the characteristics of large swing signal handling capability, providing low distortion in its OFF state, and not disrupting the normal transmitting operation or function of the transmitter, etc. Due to the circuit complexity of both the receiver and the transmitter, however, it is very difficult to accomplish the above-mentioned characteristics in the external T/R switch without having to drastically reduce the maximum allowable input RF (Radio Frequency) signal to the receiver and/or the maximum transmitted output power. Therefore, providing a switch that meets the above-mentioned requirements to switch between the receiver and the transmitter in the wireless communication system has become an important issue in this field.

SUMMARY

One of the objectives of the present embodiments is to provide a signal transceiver having the characteristics of high linearity and low noise figure.

According to an embodiment of the present invention, a signal transceiver is provided. The signal transceiver comprises a first power amplifier, an impedance transforming circuit, a switching circuit, and a receiving amplifier. The first power amplifier is coupled to a chip output port of a chip. The switching circuit is arranged to selectively couple the chip output port to a first port of the impedance transforming circuit. The receiving amplifier is coupled to a second port of the impedance transforming circuit.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
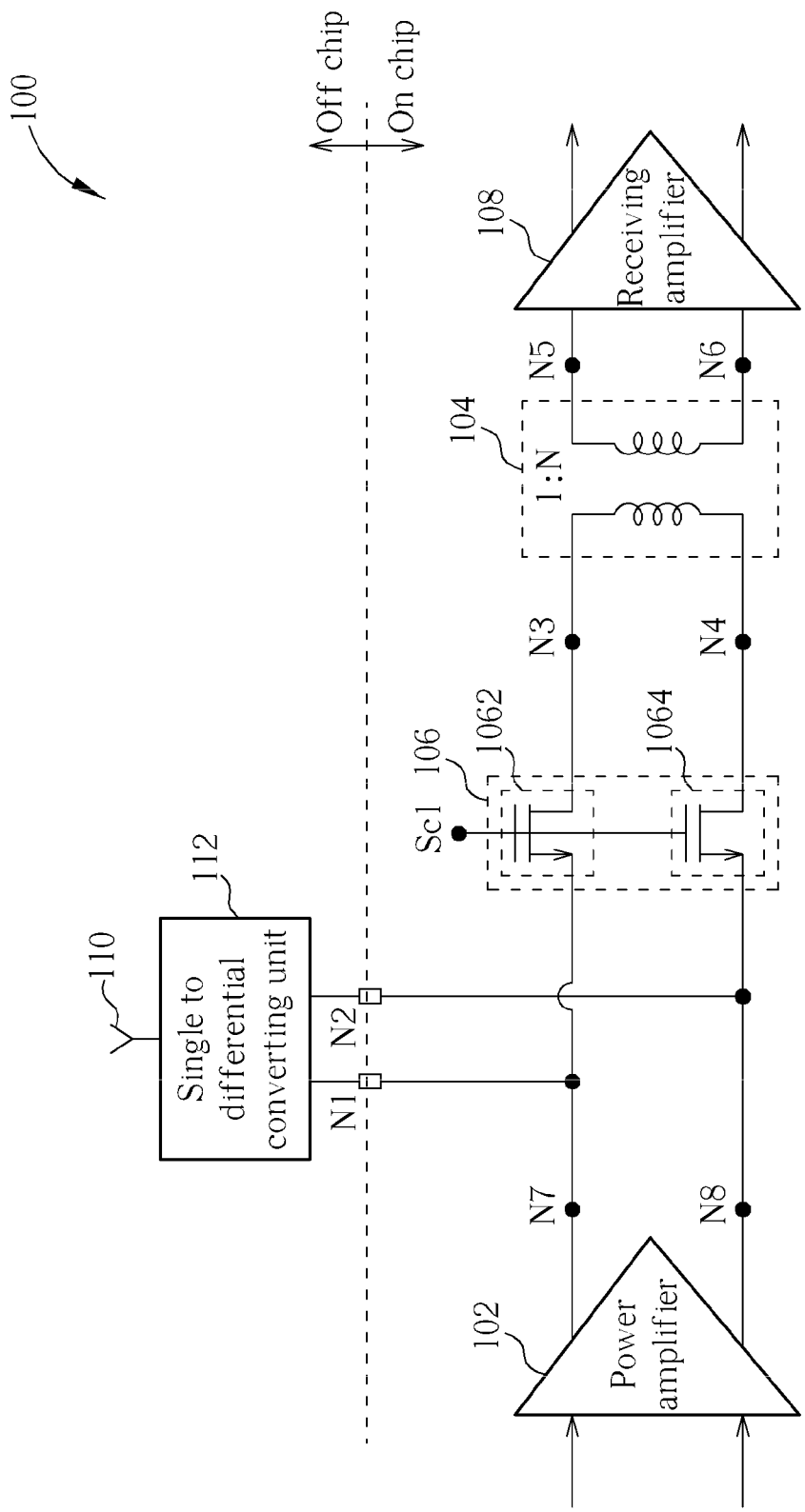
FIG. 1 is a diagram illustrating a signal transceiver according to a first embodiment of the present invention.

Please refer to FIG. 1, which is a diagram illustrating a signal transceiver 100 according to a first embodiment of the present invention. The signal transceiver 100 comprises a power amplifier 102, an impedance transforming circuit 104, a switching circuit 106, and a receiving amplifier 108. The receiving amplifier 108 may be a low-noise amplifier (LNA). The power amplifier 102, the impedance transforming circuit 104, the switching circuit 106, and the receiving amplifier 108 are all disposed in a chip. The signal transceiver 100 may be a front end circuit of a wireless communication system. An antenna 110 and a single to differential converting unit 112 are also shown in FIG. 1. The power amplifier 102 is coupled to a chip output port comprising a first node N1 and a second node N2 of the chip. The switching circuit 106 is arranged to selectively couple the chip output port (N1, N2) to a first port comprising a first node N3 and a second node N4 of the impedance transforming circuit 104. The receiving amplifier 108 is coupled to a second port comprising a first node N5 and a second node N6 of the impedance transforming circuit 104. The single to differential converting unit 112 is coupled to the chip output port (N1, N2), and the antenna 110 is coupled to the single to differential converting unit 112 as shown in FIG. 1. An off-chip matching network (not shown) may also be installed between the chip output port (N1, N2) and the single to differential converting unit 112. Depending on the different embodiments, the present single to differential converting unit may be a balun circuit (Balanced-unbalanced circuit) or a balanced band-passed filter.

According to the exemplary embodiment, the signal transceiver 100 is a differential signal transceiver, although this is not a limitation of the present invention. The impedance transforming circuit 104 may be a transformer. The switching circuit 106 is directly connected to the chip output port (N1, N2), and the differential output terminals (a first output terminal N7 and a second output terminal N8) of the power amplifier 102 are directly connected to the chip output port (N1, N2) respectively. The switching circuit 106 comprises a first switch 1062 and a second switch 1064. The first switch 1062 has a first connecting terminal directly connected to the first node N1 of the chip output port, and a second connecting terminal coupled to the first node N3 of the first port of the impedance transforming circuit 104, and a control terminal arranged for receiving a control signal Sc1. The second switch 1064 has a first connecting terminal directly connected to the second node N2 of the chip output port, and a second connecting terminal coupled to the second node N4 of the first port of the impedance transforming circuit 104, and a control terminal arranged for receiving the control signal Sc1. In this exemplary embodiment, the ratio of the turns in the primary windings over the turns in the secondary windings of the impedance transforming circuit 104 is 1:N as shown in FIG. 1. Furthermore, the first switch 1062 and the second switch 1064 are implemented as two N-type field-effected transistors, but this is not a limitation of the present invention.

When the signal transceiver 100 operates under a receiving mode, the control signal Sc1 turns on (i.e. closes) the first switch 1062 and the second switch 1064 to pass a receiving signal Sr1 received at the chip output port (N1, N2) to the first port (N3, N4) of the impedance transforming circuit 104, and the power amplifier 102 is disabled. When the signal transceiver 100 operates under a transmitting mode, the power amplifier 102 is arranged to generate a transmitting signal St1 to the chip output port, and the control signal Sc1 turns off (i.e. opens) the first switch 1062 and the second switch 1064 to stop the transmitting signal St1 from arriving at the first port of the impedance transforming circuit 104.

Figure 2:
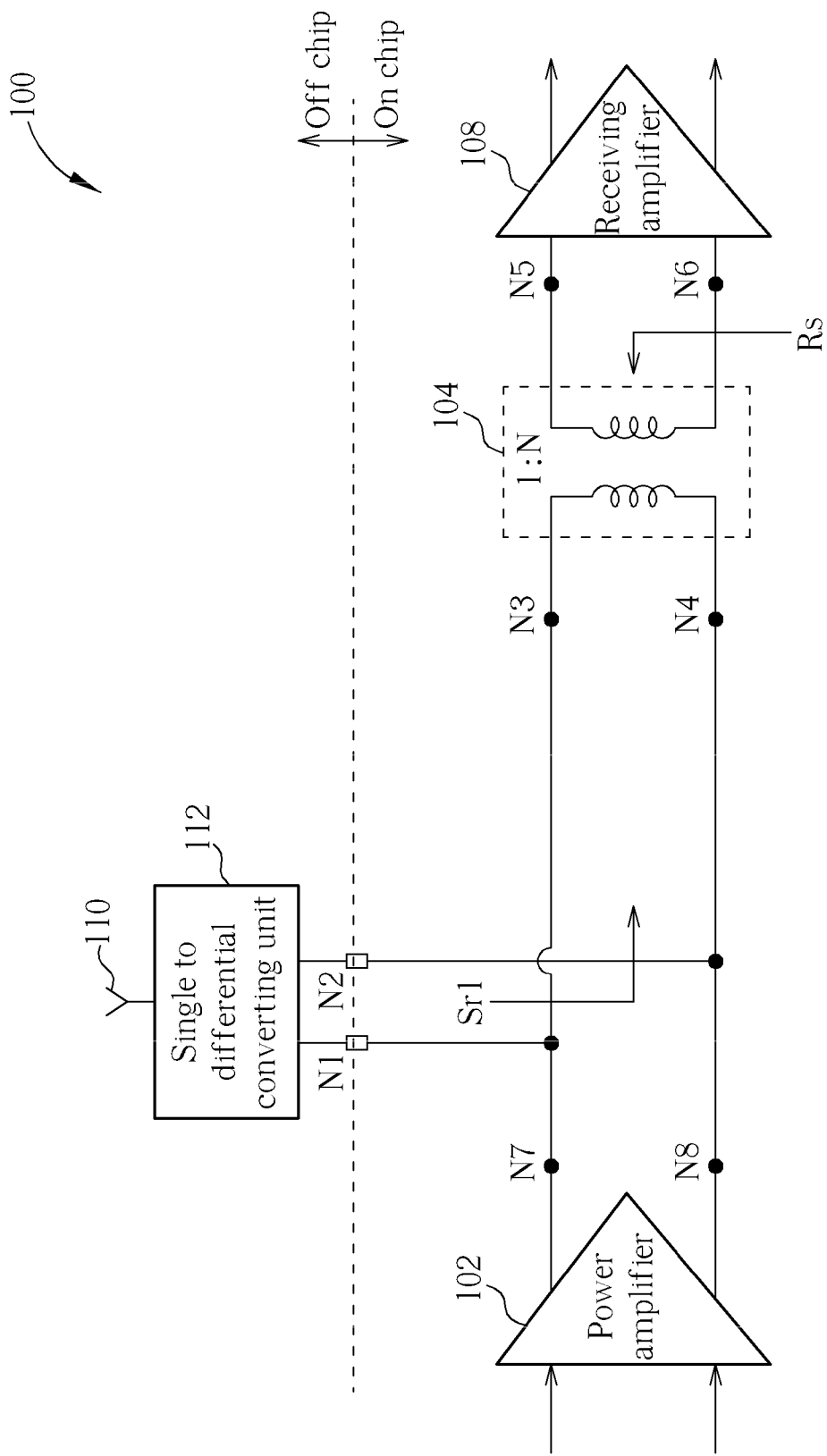
FIG. 2 is a simplified diagram illustrating a signal transceiver operating under a receiving mode according to an embodiment of the present invention.

When the signal transceiver 100 operates under the receiving mode, the signal transceiver 100 can be simplified as FIG. 2, which is a simplified diagram illustrating the signal transceiver 100 operating under the receiving mode according to an embodiment of the present invention. The noise figure NF of the receiving amplifier 108 can be expressed by the following equation (1):

$$NF = 1 + \left(\frac{V_n^2}{4*K*T*Rs}\right). \quad (1)$$

In which, the parameter K represents the coupling factor of the transformer, T represents the temperature, Rs represents the source impedance of the receiving amplifier 108, N is the transformer's windings turn ratio, and $V_n^2$ represents the voltage noise source of the receiving amplifier 108.

According to the exemplary embodiment, when the transformer's windings turn ratio N is larger, the source impedance Rs of the receiving amplifier 108 is also larger, which makes the noise figure NF of the receiving amplifier 108 smaller. In other words, when the transformer's windings turn ratio N is larger, the noise figure NF is smaller, and vice versa. In this exemplary embodiment, the impedance transforming circuit 104 in conjunction with the switching circuit 106 makes the noise figure NF of the receiving amplifier 108 smaller when the signal transceiver 100 operates under the receiving mode.

Figure 3:
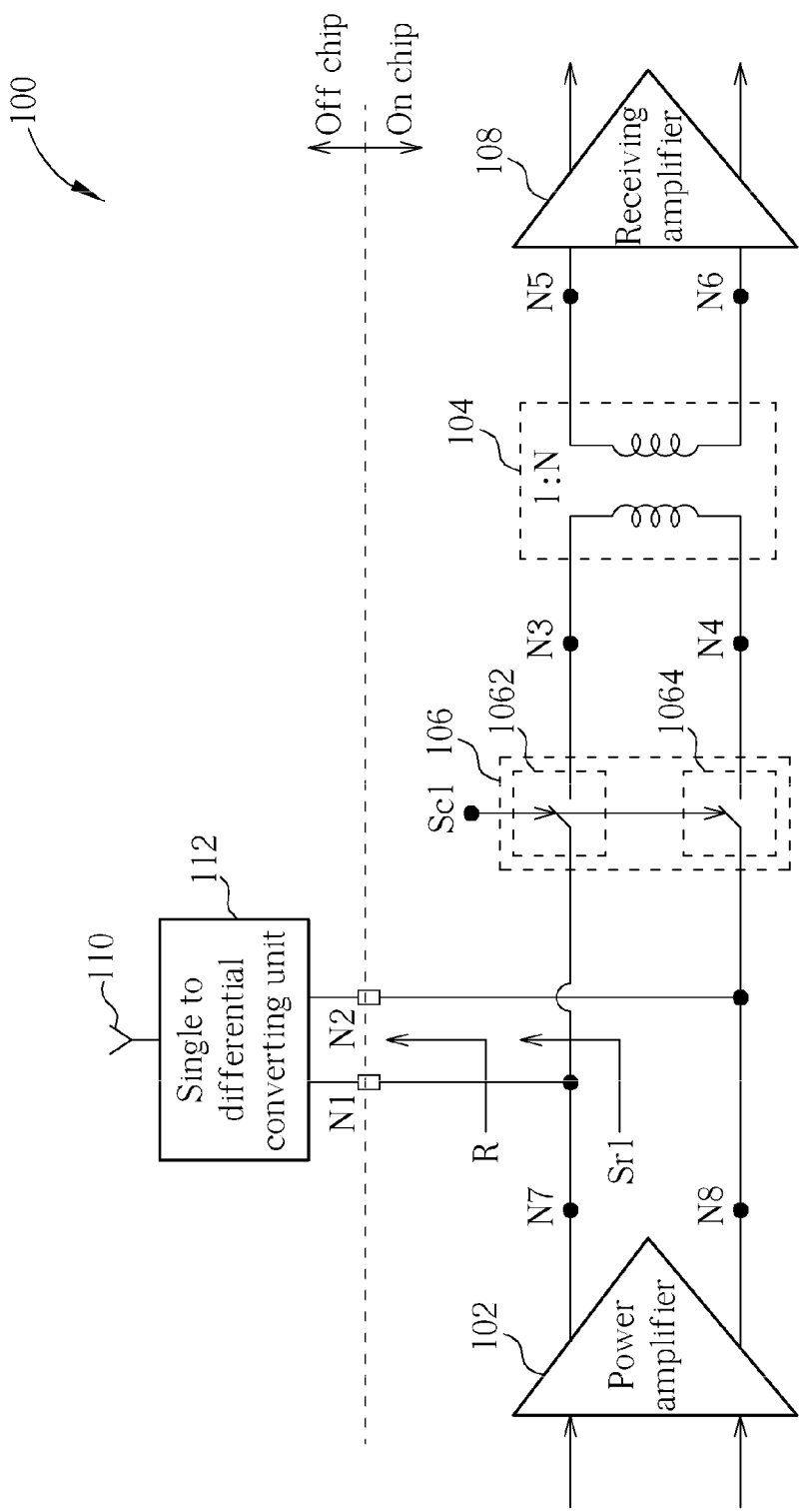
FIG. 3 is a simplified diagram illustrating a signal transceiver operating under a transmitting mode according to an embodiment of the present invention.

When the signal transceiver 100 operates under the transmitting mode, the signal transceiver 100 can be simplified as FIG. 3, which is a simplified diagram illustrating the signal transceiver 100 operating under the transmitting mode according to an embodiment of the present invention. The output power P of the power amplifier 102 can be expressed by the following equation (2):

$$P = \frac{Vamp^2}{R}. \quad (2)$$

In which, the parameter Vamp represents the amplitude of the output voltage of the power amplifier 102, and R represents the loading impedance of the power amplifier 102.

When the first output terminal N7 and the second output terminal N8 of the power amplifier 102 are directly connected to the chip output port (N1, N2), the loading impedance R of the power amplifier 102 is minimized, which maximizes the output power P of the power amplifier 102. More specifically, according to the exemplary embodiment, since no physical series switch is installed on the path between the power amplifier 102 and the chip output port (N1, N2), the path insertion loss becomes smaller, and the output power P of the power amplifier 102 becomes larger. Because there is no physical switch on signal path, the linearity of the power amplifier 102 is better when the signal transceiver 100 operates under the transmitting mode.

Figure 4:
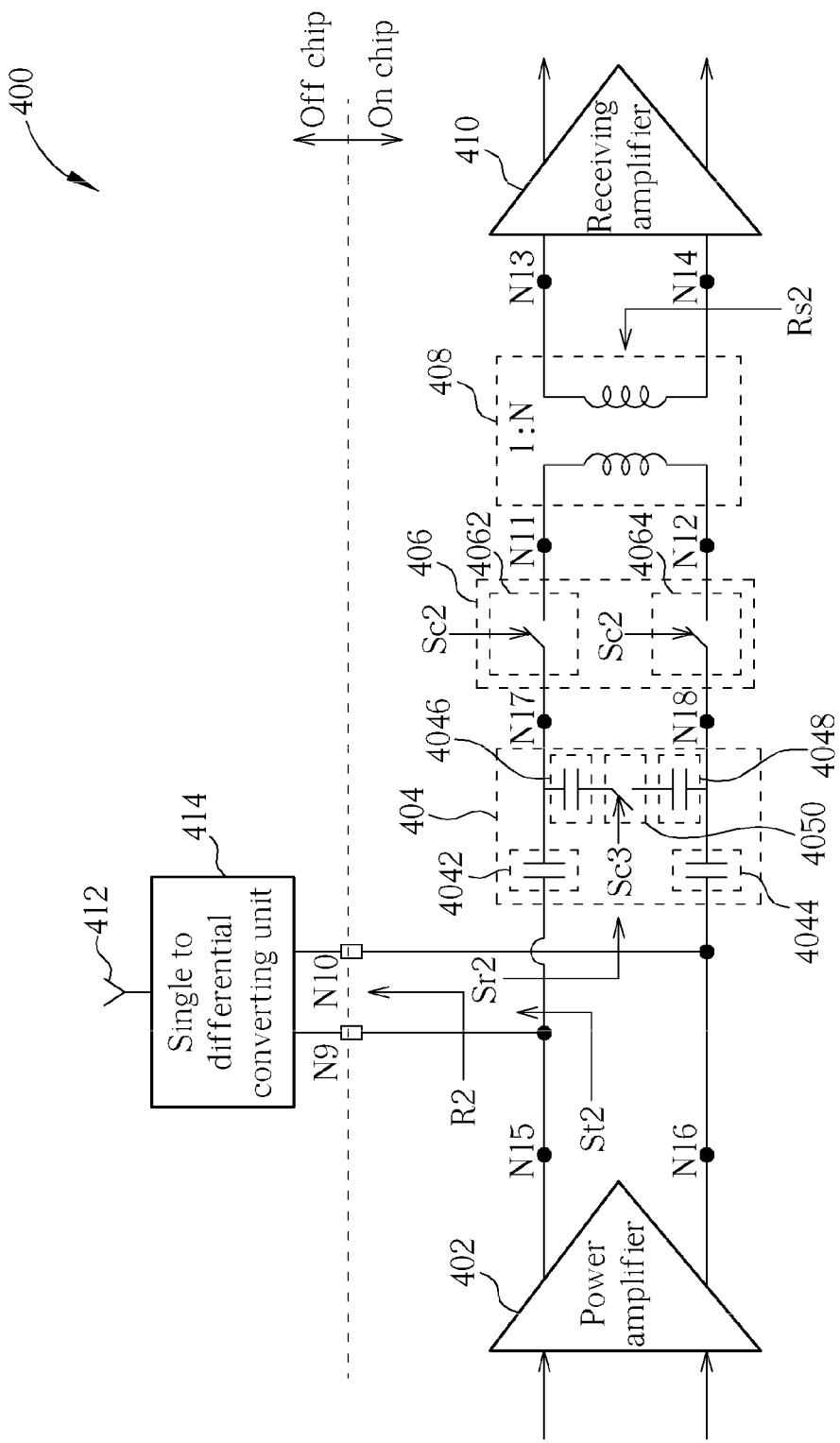
FIG. 4 is a diagram illustrating a signal transceiver according to a second embodiment of the present invention.

Please refer to FIG. 4, which is a diagram illustrating a signal transceiver 400 according to a second embodiment of the present invention, in which the signal transceiver 400 is a differential signal transceiver, although this is not a limitation of the present invention. The signal transceiver 400 comprises a power amplifier 402, a capacitive circuit 404, a switching circuit 406, an impedance transforming circuit 408, a receiving amplifier 410, an antenna 412 and a single to differential converting unit 414. The receiving amplifier 410 may be a low-noise amplifier (LNA). The power amplifier 402, the capacitive circuit 404, the switching circuit 406, the impedance transforming circuit 408, and the receiving amplifier 410 are all disposed in a chip. The antenna 412 and the single to differential converting unit 414 are externally coupled to the chip. The signal transceiver 400 may be a front end circuit of a wireless communication system. The power amplifier 402 is coupled to a chip output port comprising a first node N9 and a second node N10 of the chip. The capacitive circuit 404 is coupled between the chip output port (N9, N10) and the switching circuit 406. The switching circuit 106 is arranged to selectively couple the capacitive circuit 404 to a first port comprising a first node N11 and a second node N12 of the impedance transforming circuit 408. The receiving amplifier 410 is coupled to a second port comprising a first node N13 and a second node N14 of the impedance transforming circuit 408. The single to differential converting unit 414 is coupled to the chip output port (N9, N10), and the antenna 412 is coupled to the single to differential converting unit 414 as shown in FIG. 4. It is noted that an off-chip matching network (not shown) may also be installed between the chip output port (N9, N10) and the single to differential converting unit 414. The impedance transforming circuit 408 may be a transformer.

The differential output terminals (a first output terminal N15 and a second output terminal N16) of the power amplifier 402 are directly connected to the chip output port (N9, N10) respectively. The switching circuit 406 comprises a first switch 4062 and a second switch 4064. The first switch 4062 has a first connecting terminal coupled to the first terminal N11 of the first port, a second connecting terminal N17 coupled to a first terminal of the capacitive circuit 404, and a control terminal arranged for receiving a control signal Sc2. The second switch 4064 has a first connecting terminal coupled to the second terminal N12 of the first port, a second connecting terminal N18 coupled to a second terminal of the capacitive circuit 404, and a control terminal arranged for receiving the control signal Sc2.

The capacitive circuit 404 comprises a plurality of capacitors 4042, 4044, 4046, 4048, and a switch 4050. The capacitor 4042 has a first terminal coupled to the first node N9 and a second terminal coupled to the second connecting terminal N17. The second capacitor 4044 has a first terminal coupled to the second node N10 and a second terminal coupled to the second connecting terminal N18. The capacitor 4046 has a first terminal coupled to the second connecting terminal N17, and a second terminal coupled to a first connecting terminal of the switch 4050. The second capacitor 4048 has a first terminal coupled to the second connecting terminal N18, and a second terminal coupled to a second connecting terminal of the switch 4050. The control terminal of the switch 4050 is further coupled to a control signal Sc3.

The ratio of the turns in the primary windings over the turns in the secondary windings of the impedance transforming circuit 408 is 1:N as shown in FIG. 4. The first switch 4062, the second switch 4064, and the switch 4050 may be implemented as three N-type field-effected transistors respectively, but this is not a limitation of the present invention.

According to the exemplary embodiment, the capacitive circuit 404 is a capacitive divider arranged to divide the differential output voltage generated by the power amplifier 402 when the signal transceiver 400 operates under a transmitting mode. More specifically, when the signal transceiver 400 operates under the transmitting mode, the power amplifier 402 is arranged to generate a transmitting signal St2 to the chip output port, and the control signal Sc2 turns off (i.e. opens) the first switch 4062 and the second switch 4064 to stop the transmitting signal St2 from arriving at the first port of the impedance transforming circuit 408. Meanwhile, the control signal Sc3 turns on (i.e. closes) the switch 4050 to make the capacitors 4042, 4044, 4046, 4048 form a capacitive divider to divide the differential voltage of the transmitting signal St2. Accordingly, the voltage swings on the second connecting terminals N17, N18 are decreased due to the series connected capacitors 4042, 4044, 4046, 4048. If the first switch 4062 and the second switch 4064 are implemented as N-type field-effect transistors, the large swings of the transmitting signal St2 will not affect the off state of the first switch 4062 and the second switch 4064 since the voltage swings at the second connecting terminals N17, N18 have been decreased by the capacitive divider.

When the signal transceiver 400 operates under a receiving mode, the control signal Sc2 turns on (i.e. closes) the first switch 4062 and the second switch 4064 to pass a receiving signal Sr2 received at the chip output port (N9, N10) to the first port (N11, N12) of the impedance transforming circuit 408, and the power amplifier 402 is disabled. Meanwhile, the control signal Sc3 turns off (i.e. opens) the switch 4050 to open the connecting path between the capacitor 4046 and the capacitor 4048.

Since no physical series switch is installed on the path between the power amplifier 402 and the chip output port (N9, N10), the path signal loss is minimized. Because there is no physical switch on the signal path, the linearity of the power amplifier 402 is therefore better in comparison to the conventional counterpart when the signal transceiver 400 operates under the transmitting mode.

According to the description of the first embodiment, the source impedance Rs2 of the receiving amplifier 410 is larger due to the impedance transforming circuit 408, meaning the noise figure of the receiving amplifier 410 is smaller in comparison to the conventional counterpart when the signal transceiver 400 operates under the receiving mode.

Figure 5:
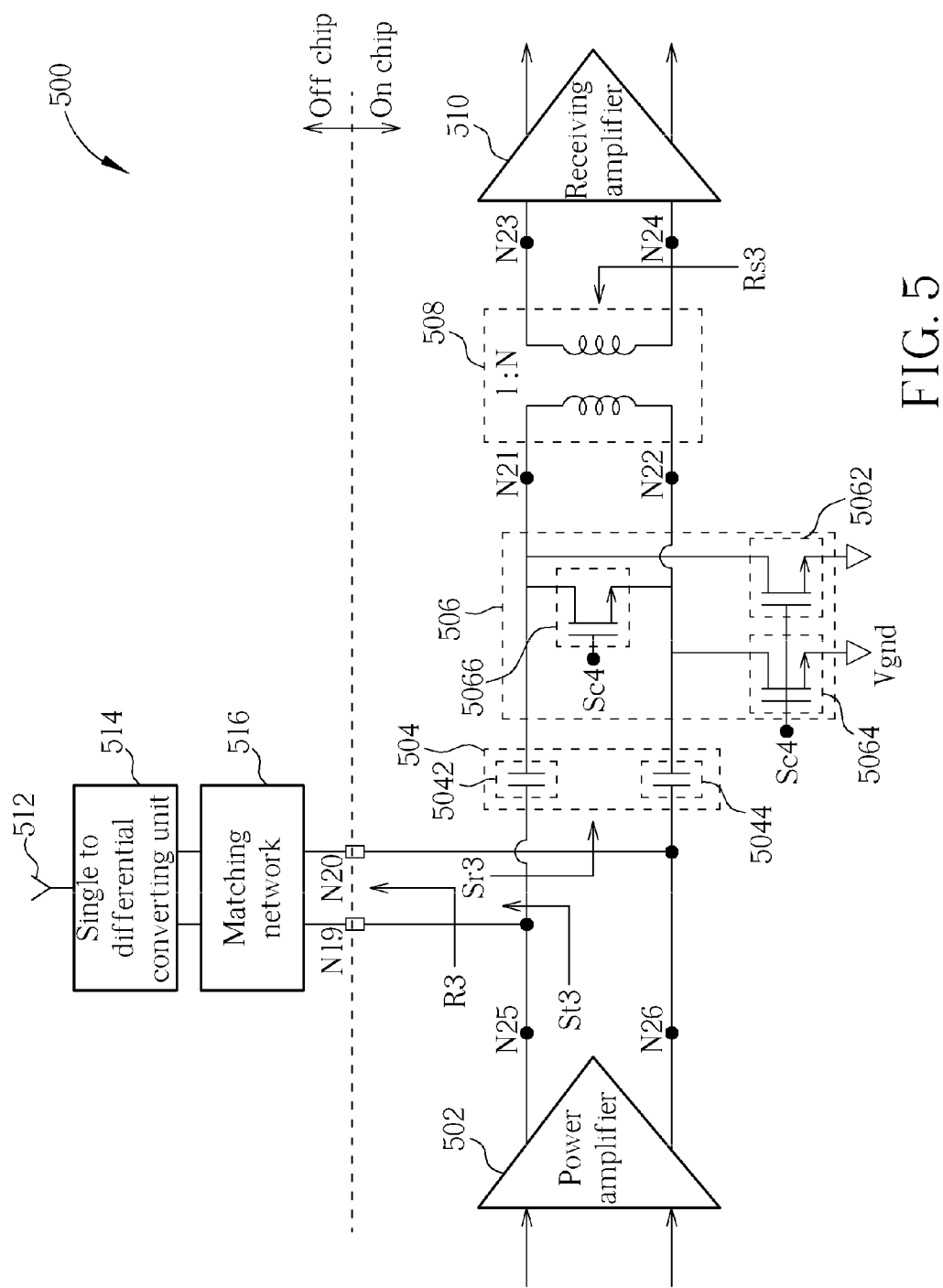
FIG. 5 is a diagram illustrating a signal transceiver according to a third embodiment of the present invention.

Please refer to FIG. 5, which is a diagram illustrating a signal transceiver 500 according to a third embodiment of the present invention, in which the signal transceiver 500 is a differential signal transceiver although this is not a limitation of the present invention. The signal transceiver 500 comprises a power amplifier 502, a capacitive circuit 504, a switching circuit 506, an impedance transforming circuit 508, a receiving amplifier 510, an antenna 512, a single to differential converting unit 514, and a matching network 516. The receiving amplifier 510 may be a low-noise amplifier (LNA). The power amplifier 502, the capacitive circuit 504, the switching circuit 506, the impedance transforming circuit 508, and the receiving amplifier 510 are all disposed in a chip. The antenna 512, the single to differential converting unit 514, and the matching network 516 are externally coupled to the chip. The signal transceiver 500 may be a front end circuit of a wireless communication system. The power amplifier 502 is coupled to a chip output port comprising a first node N19 and a second node N20 of the chip. The capacitive circuit 504 is coupled between the chip output port (N19, N20) and a first port of the impedance transforming circuit 508. The switching circuit 506 is arranged to selectively couple a first node N21 and a second node N22 of the first port to a reference voltage, e.g. a ground voltage Vgnd. The receiving amplifier 510 is coupled to a second port comprising a first node N23 and a second node N24 of the impedance transforming circuit 508.

The matching network 516 is coupled to the chip output port (N19, N20) to perform an impedance matching for the power amplifier 502 or the receiving amplifier 510. The single to differential converting unit 514 is coupled between the matching network 516 and the antenna 512 as shown in FIG. 5. The impedance transforming circuit 508 may be a transformer.

The differential output terminals (a first output terminal N25 and a second output terminal N26) of the power amplifier 502 are directly connected to the chip output port (N19, N20) respectively. The capacitive circuit 504 comprises a first capacitor 5042 and a second capacitor 5044. The first capacitor 5042 has a first terminal coupled to the first node N19 and a second terminal coupled to the first node N21. The second capacitor 5044 has a first terminal coupled to the second node N20 and a second terminal coupled to the second node N22.

The switching circuit 506 comprises a first switch 5062, a second switch 5064, and a third switch 5066. The first switch 5062 has a first connecting terminal coupled to the first node N21, a second connecting terminal coupled to a reference voltage, e.g. a ground voltage Vgnd, and a control terminal coupled to a control signal Sc4. The second switch 5064 has a first connecting terminal coupled to the second node N22, a second connecting terminal coupled to the reference voltage, and a control terminal coupled to the control signal Sc4. The third switch 5066 has a first connecting terminal coupled to the first node N21, a second connecting terminal coupled to the second node N22, and a control terminal coupled to the control signal Sc4.

When the signal transceiver 500 operates under the transmitting mode, the power amplifier 502 is arranged to generate a transmitting signal St3 to the chip output port, and the control signal Sc4 turns on (i.e. closes) the first switch 5062, the second switch 5064, and the third switch 5066 to stop the transmitting signal St3 from arriving at the first port of the impedance transforming circuit 508. More specifically, when the signal transceiver 500 operates under the transmitting mode, the voltage level of the second terminal (N21) of the first capacitor 5042 equals the second terminal (N22) of the second capacitor 5044, and the second terminal (N21) of the first capacitor 5042 and the second terminal (N22) of the second capacitor 5044 are further coupled to the ground voltage Vgnd. Therefore, if the first switch 5062, the second switch 5064, and the third switch 5066 are implemented as N-type field-effect transistors, the large swings of the transmitting signal St3 will not affect the on state of the first switch 5062 and the second switch 5064 since the first node N21 and the second node N22 of the impedance transforming circuit 508 are coupled to the ground voltage Vgnd during the transmitting mode. It should be noted that the third switch 5066 is an optional switch for the signal transceiver 500.

When the signal transceiver 500 operates under a receiving mode, the control signal Sc4 turns off (i.e. opens) the first switch 5062, the second switch 5064, and the third switch 5066 to pass a receiving signal Sr3 received at the chip output port (N19, N20) to the first port (N21, N22) of the impedance transforming circuit 508, and the power amplifier 502 is disabled.

Since no physical series switch is installed on the path between the power amplifier 502 and the chip output port (N19, N20), the signal path loss of the power amplifier 502 is minimized. Because there is no physical switch on the signal path, the linearity of the power amplifier 502 is therefore better in comparison to the conventional counterpart when the signal transceiver 500 operates under the transmitting mode.

According to the description of the first embodiment, the source impedance Rs3 of the receiving amplifier 510 is larger due to the impedance transforming circuit 508, meaning the noise figure of the receiving amplifier 510 is smaller in comparison to the conventional counterpart when the signal transceiver 500 operates under the receiving mode.

Figure 6:
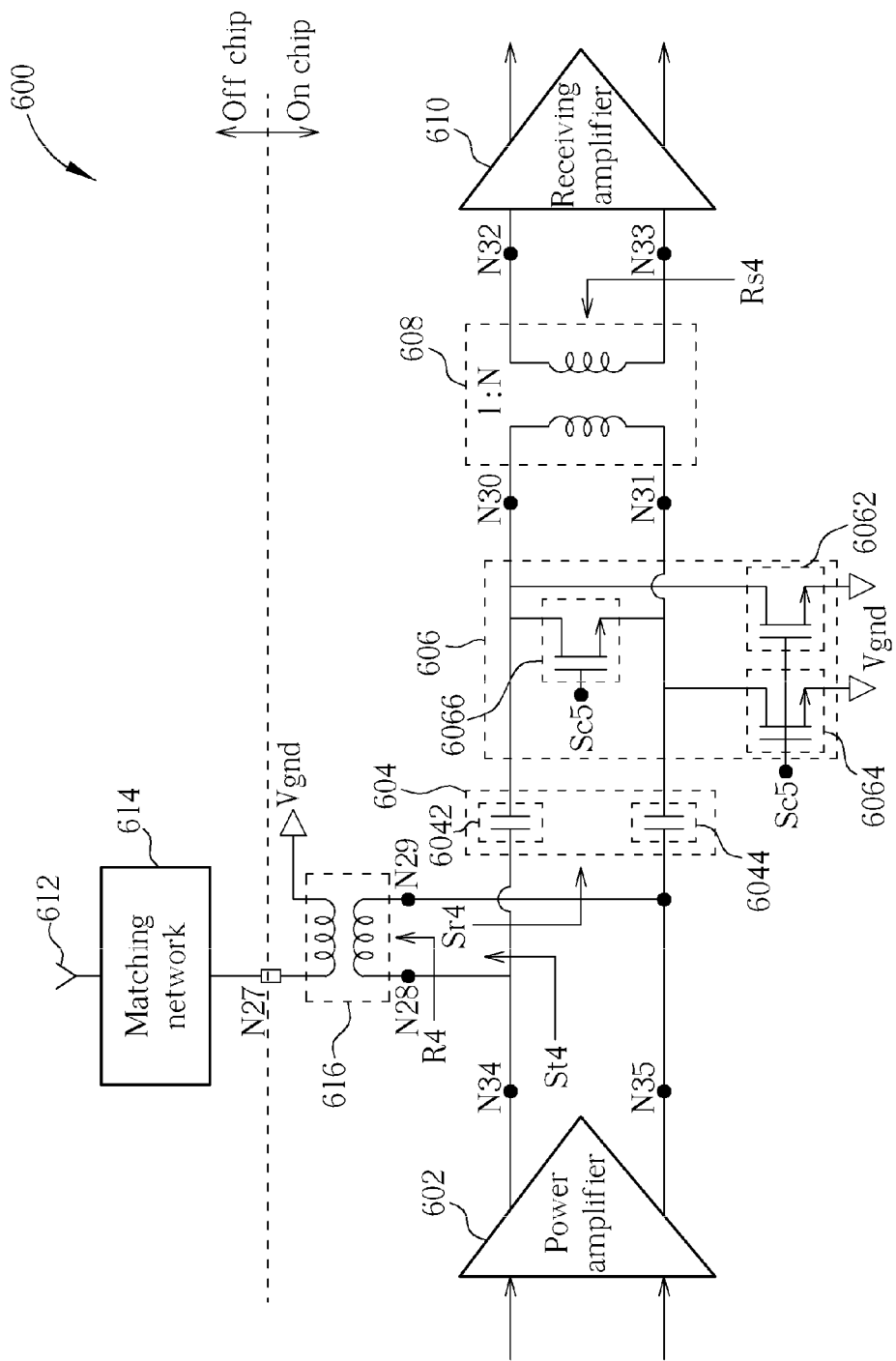
FIG. 6 is a diagram illustrating a signal transceiver according to a fourth embodiment of the present invention.

Please refer to FIG. 6, which is a diagram illustrating a signal transceiver 600 according to a fourth embodiment of the present invention, in which the signal transceiver 600 is a differential signal transceiver although this is not a limitation of the present invention. The signal transceiver 600 comprises a power amplifier 602, a capacitive circuit 604, a switching circuit 606, an impedance transforming circuit 608, a receiving amplifier 610, an antenna 612, a matching network 614, and a balun circuit (Balance-unbalance circuit) 616. The balun circuit 616 is a single to differential converting unit, which is utilized to convert a single-ended signal into a differential signal when the signal transceiver operates under the receiving mode, and to convert a differential signal into a single-ended signal when the signal transceiver operates under the transmitting mode. The receiving amplifier 610 may be a low-noise amplifier (LNA). The power amplifier 602, the capacitive circuit 604, the switching circuit 606, the impedance transforming circuit 608, the receiving amplifier 610, and the balun circuit 616 are all disposed in a chip. The antenna 612 and the matching network 614 are externally coupled to the chip. The signal transceiver 600 may be a front end circuit of a wireless communication system. A first connecting terminal of the balun circuit 616 is coupled to a chip output port comprising a node N27 of the chip, and a second connecting terminal of the balun circuit 616 is coupled to a reference voltage, e.g. the ground voltage Vgnd. The power amplifier 602 is coupled to the chip output port via the balun circuit 616. The power amplifier 602 comprises a first output terminal and a second output terminal coupled to a third connecting terminal N28 and a fourth connecting terminal N29 of the balun circuit 616 respectively.

The capacitive circuit 604 is coupled between the balun circuit 616 (N28, N29) and a first port of the impedance transforming circuit 608. The switching circuit 606 is arranged to selectively couple a first node N30 and a second node N31 of the first port to a reference voltage, e.g. the ground voltage Vgnd. The receiving amplifier 610 is coupled to a second port comprising a first node N32 and a second node N33 of the impedance transforming circuit 608. The matching network 614 is coupled between the balun circuit 616 and the antenna 612 as shown in FIG. 6. The impedance transforming circuit 608 may be a transformer.

The differential output terminals (a first output terminal N34 and a second output terminal N35) of the power amplifier 602 are directly connected to the third connecting terminal N28 and the fourth connecting terminal N29 of the balun circuit 616, respectively. The capacitive circuit 604 comprises a first capacitor 6042 and a second capacitor 6044. The first capacitor 6042 has a first terminal coupled to the third connecting terminal N28 and a second terminal coupled to the first node N30. The second capacitor 5044 has a first terminal coupled to the fourth connecting terminal N29 and a second terminal coupled to the second node N31.

The switching circuit 606 comprises a first switch 6062, a second switch 6064, and a third switch 6066. The first switch 6062 has a first connecting terminal coupled to the first node N30, a second connecting terminal coupled to a reference voltage, e.g. the ground voltage Vgnd, and a control terminal coupled to a control signal Sc5. The second switch 6064 has a first connecting terminal coupled to the second node N31, a second connecting terminal coupled to the reference voltage, and a control terminal coupled to the control signal Sc5. The third switch 6066 has a first connecting terminal coupled to the first node N30, a second connecting terminal coupled to the second node N31, and a control terminal coupled to the control signal Sc5.

When the signal transceiver 600 operates under the transmitting mode, the power amplifier 602 is arranged to generate a transmitting signal St4 to the balun circuit 616, and the control signal Sc5 turns on (i.e. closes) the first switch 6062, the second switch 6064, and the third switch 6066 to stop the transmitting signal St4 from arriving at the first port of the impedance transforming circuit 608, wherein the balun circuit 616 is utilized to transform the differential transmitting signal St4 into a single ended signal for transmitting. More specifically, when the signal transceiver 600 operates under the transmitting mode, the voltage level of the second terminal (N30) of the first capacitor 6042 equals the second terminal (N31) of the second capacitor 6044, and the second terminal (N30) of the first capacitor 6042 and the second terminal (N31) of the second capacitor 6044 are further coupled to the ground voltage Vgnd. Therefore, if the first switch 6062, the second switch 6064, and the third switch 6066 are implemented as N-type field-effect transistors, the large swings of the transmitting signal St4 will not affect the on state of the first switch 6062 and the second switch 6064 since the first node N30 and the second node N31 of the impedance transforming circuit 608 are coupled to the ground voltage Vgnd during the transmitting mode. It should be noted that the third switch 6066 is an optional switch for the signal transceiver 600.

When the signal transceiver 500 operates under a receiving mode, the control signal Sc5 turns off (i.e. opens) the first switch 6062, the second switch 6064, and the third switch 6066 to pass a receiving signal Sr4 received at the balun circuit (N28, N29) to the first port (N30, N31) of the impedance transforming circuit 608, and the power amplifier 602 is disabled, wherein the receiving signal Sr4 is a differential signal generated by the balun circuit 616 which receives a single ended signal from the matching network 614.

Since no physical series switch is installed on the path between the power amplifier 602 and the chip output port (N27), the path loss of the power amplifier 602 is minimized. Because there is no physical switch on the signal path, the linearity of the power amplifier 602 is therefore better in comparison to the conventional counterpart when the signal transceiver 600 operates under the transmitting mode.

According to the description of the first embodiment, the source impedance Rs4 of the receiving amplifier 610 is larger due to the impedance transforming circuit 608, meaning the noise figure of the receiving amplifier 610 is smaller in comparison to the conventional counterpart when the signal transceiver 600 operates under the receiving mode.

Figure 7:
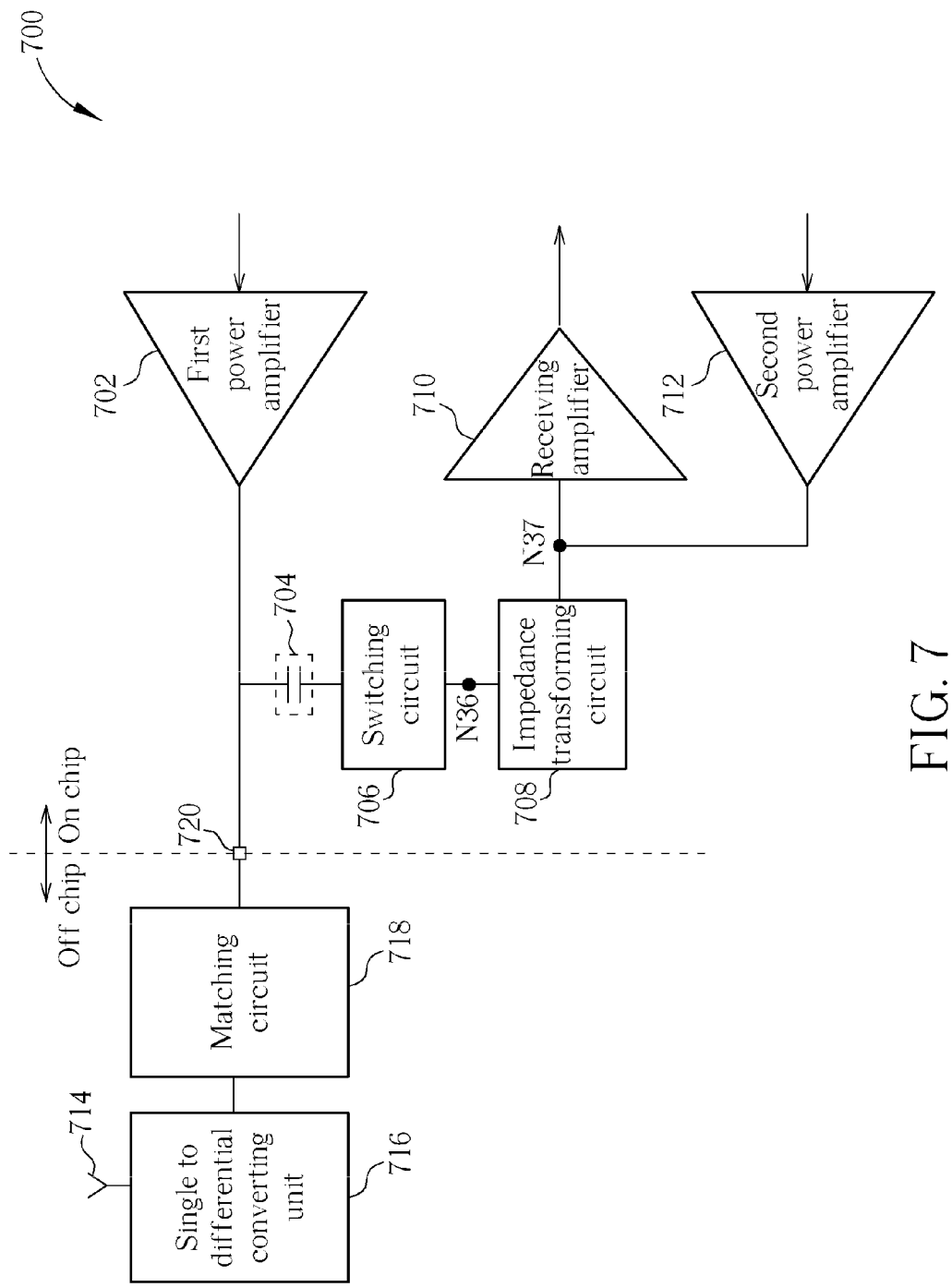
FIG. 7 is a diagram illustrating a signal transceiver according to a fifth embodiment of the present invention.

Please refer to FIG. 7, which is a diagram illustrating a signal transceiver 700 according to a fifth embodiment of the present invention. The signal transceiver 700 comprises a first power amplifier 702, a capacitive circuit 704, a switching circuit 706, an impedance transforming circuit 708, a receiving amplifier 710, a second power amplifier 712, an antenna 714, a single to differential converting unit 716, and a matching network 718. The receiving amplifier 710 may be a low-noise amplifier (LNA). The first power amplifier 702, the capacitive circuit 704, the switching circuit 706, the impedance transforming circuit 708, the receiving amplifier 710, and the second power amplifier 712 are all disposed in a chip. The antenna 714, the single to differential converting unit 716, and the matching network 718 are externally coupled to the chip. In this exemplary embodiment, the first power amplifier 702 and the capacitive circuit 704 are coupled to the matching network 718 via the chip output port 720. In other words, the first power amplifier 702 and the capacitive circuit 704 are directly connected to the chip output port 720.

The signal transceiver 700 may be a front end circuit of a first wireless communication system and a second wireless communication system corresponding to a first communication standard and a second communication standard respectively, wherein the first communication standard is different from the second communication standard. It should be noted that, even though the signal transceiver 700 is illustrated as a single ended signal transceiver, this is not a limitation of the present invention. The signal transceiver 700 may be a differential signal transceiver. The capacitive circuit 704 may be implemented as the capacitive circuit 404 or the capacitive circuit 504 illustrated in FIG. 4 or FIG. 5 respectively. The switching circuit 706 may be implemented as the switching circuit illustrated in FIG. 1, FIG. 4, or FIG. 5. The impedance transforming circuit 708 may be implemented as the impedance transforming circuit illustrated in FIG. 1, FIG. 4, FIG. 5, or FIG. 6. In addition, a balun circuit may also be applied to the signal transceiver 700 according to the method disclosed in FIG. 6; the detailed description is omitted here for brevity.

According to this exemplary embodiment, the first power amplifier 702 is utilized to transmit a first transmitting signal correspond to the first communication standard, and the second power amplifier 712 is utilized to transmit a second transmitting signal correspond to the second communication standard. When the first power amplifier 702 is arranged to generate the first transmitting signal to the chip output port 720, the second power amplifier 712 is disabled, and the switching circuit 706 is arranged to stop the first transmitting signal from arriving at a first port N36 of the impedance transforming circuit 708 by the above mentioned method. When the second power amplifier 712 is arranged to generate the second transmitting signal to a second port N37 of the impedance transforming circuit 708, the first power amplifier is disabled, and the switching circuit 706 is conducted for transmitting the second transmitting signal to the chip output port 720. It should be noted that, when the second power amplifier 712 is arranged to generate the second transmitting signal, the receiving amplifier 710 may be disabled or just disconnected from the second power amplifier 712 to avoid the second transmitting signal from affecting the receiving amplifier 710.

When the signal transceiver 700 operates under the receiving mode, the switching circuit 706 is conducted for transmitting the receiving signal received from the chip output port 720 to the receiving amplifier 710, while the first power amplifier 702 and the second power amplifier 712 are disabled. In other words, the receiving amplifier 710 is a shared receiving amplifier of the first wireless communication system corresponding to the first power amplifier 702 and the second wireless communication system corresponding to the second power amplifier 712.

Since no physical series switch is installed on the path between the first power amplifier 702 and the chip output port 720, the path loss of the first power amplifier 702 is minimized. Because there is no physical switch on the signal path, the linearity of the first power amplifier 702 is therefore better in comparison to the conventional counterpart when the signal transceiver 700 operates under the transmitting mode. Furthermore, according to the description of the first embodiment, the source impedance of the receiving amplifier 710 is larger due to the impedance transforming circuit 708, meaning the noise figure of the receiving amplifier 710 is smaller in comparison to the conventional counterpart when the signal transceiver 700 operates under the receiving mode. According to the arrangement of the signal transceiver 700, the output power of the second transmitting signal generated by the second power amplifier 712 may be smaller than the output power of first transmitting signal generated by the first power amplifier 702.

Figure 8:
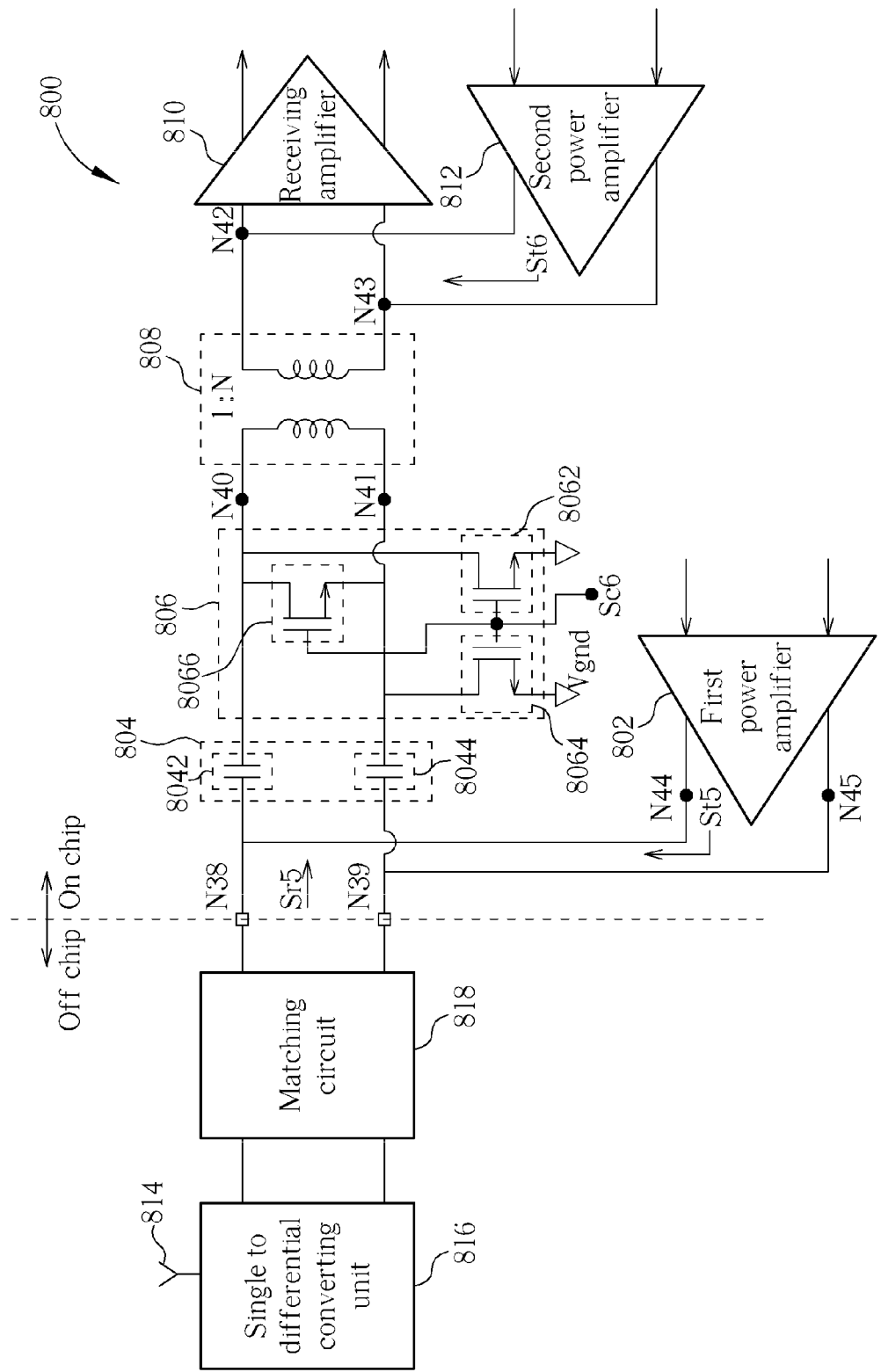
FIG. 8 is a diagram illustrating a signal transceiver according to a sixth embodiment of the present invention.

Please refer to FIG. 8, which is a diagram illustrating a signal transceiver 800 according to a sixth embodiment of the present invention, in which the signal transceiver 800 is a differential signal transceiver although this is not a limitation of the present invention. The signal transceiver 800 comprises a first power amplifier 802, a capacitive circuit 804, a switching circuit 806, an impedance transforming circuit 808, a receiving amplifier 810, a second power amplifier 812, an antenna 814, a single to differential converting unit 816, and a matching network 818. The receiving amplifier 810 may be a low-noise amplifier (LNA). The first power amplifier 802, the capacitive circuit 804, the switching circuit 806, the impedance transforming circuit 808, the receiving amplifier 810, and the second power amplifier 812 are all disposed in a chip. The antenna 814, the single to differential converting unit 816, and the matching network 818 are externally coupled to the chip. In this exemplary embodiment, the first power amplifier 802 and the capacitive circuit 804 are coupled to the matching network 818 via the chip output port comprising a first node N38 and a second node N39. The first power amplifier 802 and the capacitive circuit 804 are directly connected to the first node N38 and the second node N39.

The capacitive circuit 804 is coupled between the chip output port (N38, N39) and a first port (N40, N41) of the impedance transforming circuit 808. The switching circuit 806 is arranged to selectively couple the first node N40 and the second node N41 of the first port to a reference voltage, e.g. a ground voltage Vgnd. The receiving amplifier 810 is coupled to a second port (N42, N43) of the impedance transforming circuit 808.

The matching network 818 is coupled to the chip output port (N38, N39) to perform an impedance matching for the first power amplifier 802 or the receiving amplifier 810. The single to differential converting unit 816 is coupled between the matching network 818 and the antenna 814 as shown in FIG. 8. The impedance transforming circuit 808 may be a transformer.

The differential output terminals (a first output terminal N44 and a second output terminal N45) of the first power amplifier 802 are directly connected to the chip output port (N38, N39) respectively. The capacitive circuit 804 comprises a first capacitor 8042 and a second capacitor 8044. The first capacitor 8042 has a first terminal coupled to the first node N38 and a second terminal coupled to the first node N40. The second capacitor 8044 has a first terminal coupled to the second node N39 and a second terminal coupled to the second node N41.

The switching circuit 806 comprises a first switch 8062, a second switch 8064, and a third switch 8066. The first switch 8062 has a first connecting terminal coupled to the first node N40, a second connecting terminal coupled to a reference voltage, e.g. the ground voltage Vgnd, and a control terminal coupled to a control signal Sc6. The second switch 8064 has a first connecting terminal coupled to the second node N41, a second connecting terminal coupled to the reference voltage, and a control terminal coupled to the control signal Sc6. The third switch 8066 has a first connecting terminal coupled to the first node N40, a second connecting terminal coupled to the second node N41, and a control terminal coupled to the control signal Sc6.

The signal transceiver 800 may be a front end circuit of a first wireless communication system and a second wireless communication system corresponding to a first communication standard and a second communication standard respectively, wherein the first communication standard is different from the second communication standard. When the signal transceiver 800 operates under a first transmitting mode corresponding to the first communication standard, the first power amplifier 802 is arranged to generate a first transmitting signal St5 to the chip output port, and the control signal Sc6 turns on (i.e. closes) the first switch 8062, the second switch 8064, and the third switch 8066 to stop the first transmitting signal St5 from arriving at the first port of the impedance transforming circuit 808. The second power amplifier 812 is disabled at this time. When the signal transceiver 800 operates under the first transmitting mode, the voltage level of the second terminal (N40) of the first capacitor 8042 equals the second terminal (N41) of the second capacitor 8044, and the second terminal (N40) of the first capacitor 8042 and the second terminal (N41) of the second capacitor 8044 are further coupled to the ground voltage Vgnd. Therefore, if the first switch 8062, the second switch 8064, and the third switch 8066 are implemented as N-type field-effect transistors, the large swings of the first transmitting signal St5 will not affect the on state of the first switch 8062 and the second switch 8064 since the first node N40 and the second node N41 of the impedance transforming circuit 808 are coupled to the ground voltage Vgnd during the first transmitting mode. It should be noted that the third switch 8066 is an optional switch for the signal transceiver 800.

When the signal transceiver 800 operates under a second transmitting mode corresponding to the second communication standard, the second power amplifier 812 is arranged to generate a second transmitting signal St6 to the impedance transforming circuit 808, and the control signal Sc6 turns off (i.e. opens) the first switch 8062, the second switch 8064, and the third switch 8066 to let the second transmitting signal St5 be transmitted to the chip output port. The first power amplifier 802 is disabled at this time, and the receiving amplifier 810 is disabled or disconnected from the second power amplifier 812.

When the signal transceiver 800 operates under a receiving mode, the control signal Sc6 turns off (i.e. opens) the first switch 8062, the second switch 8064, and the third switch 8066 to pass a receiving signal Sr5 received at the chip output port (N38, N39) to the first port (N40, N41) of the impedance transforming circuit 808, and the first power amplifier 802 and the second power amplifier 812 are disabled. It is noted that the receiving amplifier 810 is a shared receiving amplifier of the communication system corresponding to the first power amplifier 802 and the communication system corresponding to the second power amplifier 812.

Since no physical series switch is installed on the path between the first power amplifier 802 and the chip output port, the path loss of the first power amplifier 802 is minimized. Because there is no physical switch on signal path, the linearity of the first power amplifier 802 is therefore better in comparison to the conventional counterpart when the signal transceiver 800 operates under the first transmitting mode. According to the description of the first embodiment, the source impedance of the receiving amplifier 810 is larger due to the impedance transforming circuit 808, meaning the noise figure of the receiving amplifier 810 is smaller in comparison to the conventional counterpart when the signal transceiver 800 operates under the receiving mode. In addition, according to the arrangement of the signal transceiver 800, the output power of the second transmitting signal St6 generated by the second power amplifier 812 may be smaller than the output power of first transmitting signal St5 generated by the first power amplifier 802.

Figure 9:
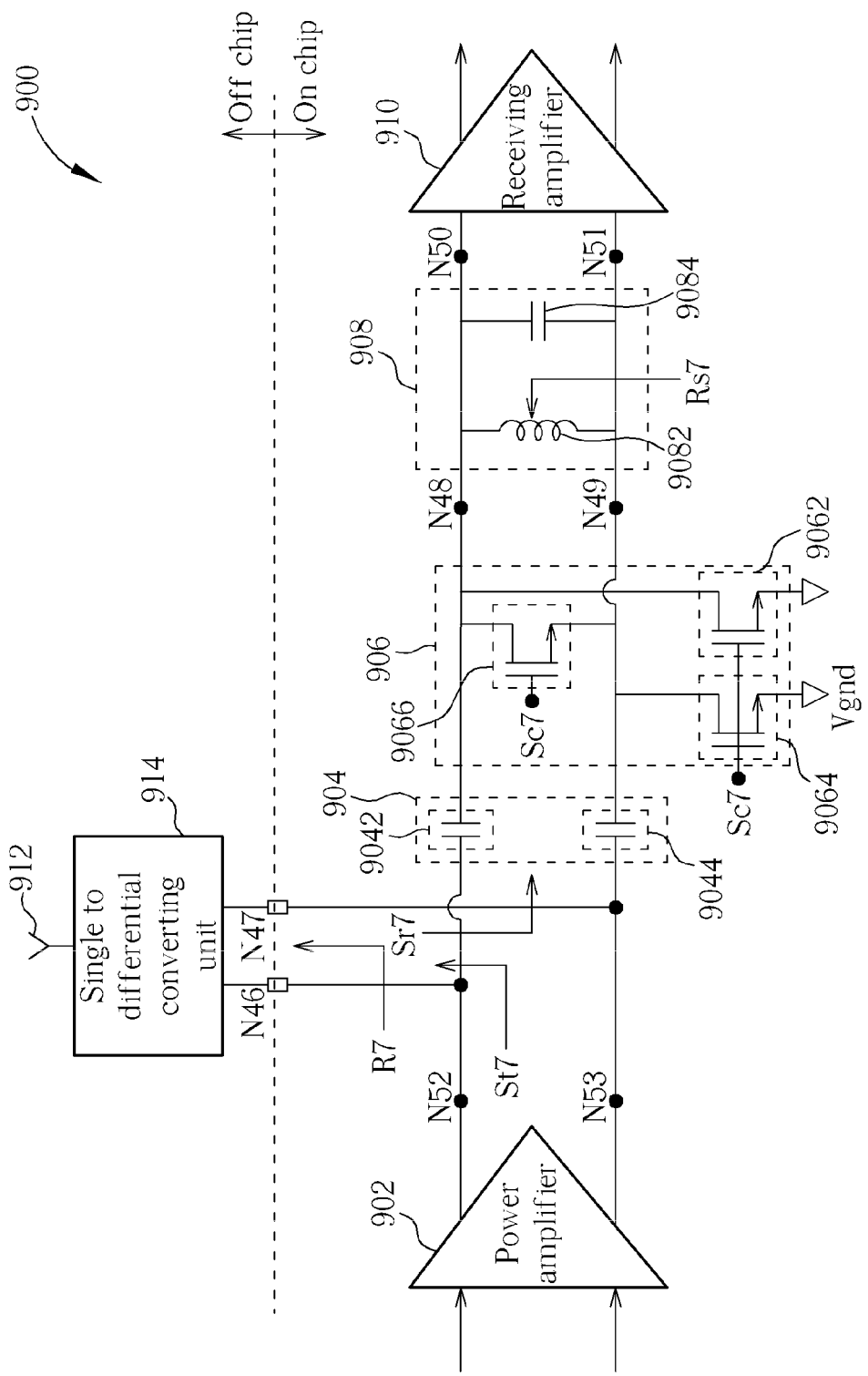
FIG. 9 is a diagram illustrating a signal transceiver according to a seventh embodiment of the present invention.

Please refer to FIG. 9, which is a diagram illustrating a signal transceiver 900 according to a seventh embodiment of the present invention, in which the signal transceiver 900 is a differential signal transceiver although this is not a limitation of the present invention. The signal transceiver 900 comprises a power amplifier 902, a capacitive circuit 904, a switching circuit 906, an impedance transforming circuit 908, a receiving amplifier 910, an antenna 912, and a single to differential converting unit 914. The receiving amplifier 910 may be a low-noise amplifier (LNA). The power amplifier 902, the capacitive circuit 904, the switching circuit 906, the impedance transforming circuit 908, and the receiving amplifier 910 are all disposed in a chip. The antenna 912 and the single to differential converting unit 914 are externally coupled to the chip. The signal transceiver 900 may be a front end circuit of a wireless communication system. The power amplifier 902 is coupled to a chip output port comprising a first node N46 and a second node N47 of the chip. The capacitive circuit 904 is coupled between the chip output port (N46, N47) and a first port of the impedance transforming circuit 908. The switching circuit 906 is arranged to selectively couple a first node N48 and a second node N49 of the first port to a reference voltage, e.g. a ground voltage Vgnd. The receiving amplifier 910 is coupled to a second port comprising a first node N50 and a second node N51 of the impedance transforming circuit 908.

The single to differential converting unit 914 is coupled between the chip output port (N46, N47) and the antenna 912 as shown in FIG. 9. The impedance transforming circuit 908 comprises an inductor 9082 and a capacitor 9084, wherein the capacitor 9084 is coupled to the inductor 9082 in parallel. A first terminal (N48) and a second terminal (N49) of the inductor 9081 are the first port of the impedance transforming circuit 908, and a first terminal (N50) and a second terminal (N51) of the capacitor 9084 are the second port of the impedance transforming circuit 908. In this embodiment, the capacitor 9084 is a variable capacitor. It is noted that the capacitor 9084 is an optional device. In other words, the impedance transforming circuit 908 may only comprise one shunt inductor (i.e., inductor 9082) connected between the terminals N48 and N49 (or the terminals N50 and N51).

The differential output terminals (a first output terminal N52 and a second output terminal N53) of the power amplifier 902 are directly connected to the chip output port (N46, N47) respectively. The capacitive circuit 904 comprises a first capacitor 9042 and a second capacitor 9044. The first capacitor 9042 has a first terminal coupled to the first node N46 and a second terminal coupled to the first node N48. The second capacitor 9044 has a first terminal coupled to the second node N47 and a second terminal coupled to the second node N49.

The switching circuit 906 comprises a first switch 9062, a second switch 9064, and a third switch 9066. The first switch 9062 has a first connecting terminal coupled to the first node N48, a second connecting terminal coupled to a reference voltage, e.g. a ground voltage Vgnd, and a control terminal coupled to a control signal Sc7. The second switch 9064 has a first connecting terminal coupled to the second node N49, a second connecting terminal coupled to the reference voltage, and a control terminal coupled to the control signal Sc7. The third switch 9066 has a first connecting terminal coupled to the first node N48, a second connecting terminal coupled to the second node N49, and a control terminal coupled to the control signal Sc7.

When the signal transceiver 900 operates under the transmitting mode, the power amplifier 902 is arranged to generate a transmitting signal St7 to the chip output port, and the control signal Sc7 turns on (i.e. closes) the first switch 9062, the second switch 9064, and the third switch 9066 to stop the transmitting signal St7 from arriving at the first port of the impedance transforming circuit 908.

When the signal transceiver 900 operates under a receiving mode, the control signal Sc7 turns off (i.e. opens) the first switch 9062, the second switch 9064, and the third switch 9066 to pass a receiving signal Sr7 received at the chip output port (N46, N47) to the first port (N48, N49) of the impedance transforming circuit 908, and the power amplifier 902 is disabled.

Since no physical series switch is installed on the path between the power amplifier 902 and the chip output port (N46, N47), the path loss of the power amplifier 902 is minimized. Because there is no physical switch on the signal path, the linearity of the power amplifier 902 is therefore better in comparison to the conventional counterpart when the signal transceiver 900 operates under the transmitting mode.

According to the description of the first embodiment, the source impedance Rs7 of the receiving amplifier 910 is larger due to the impedance transforming circuit 908, meaning the noise figure of the receiving amplifier 910 is smaller in comparison to the conventional counterpart when the signal transceiver 900 operates under the receiving mode. Moreover, since only one inductor is applied in the impedance transforming circuit 908 of this embodiment, the area of the impedance transforming circuit 908 is reduced.

Figure 10:
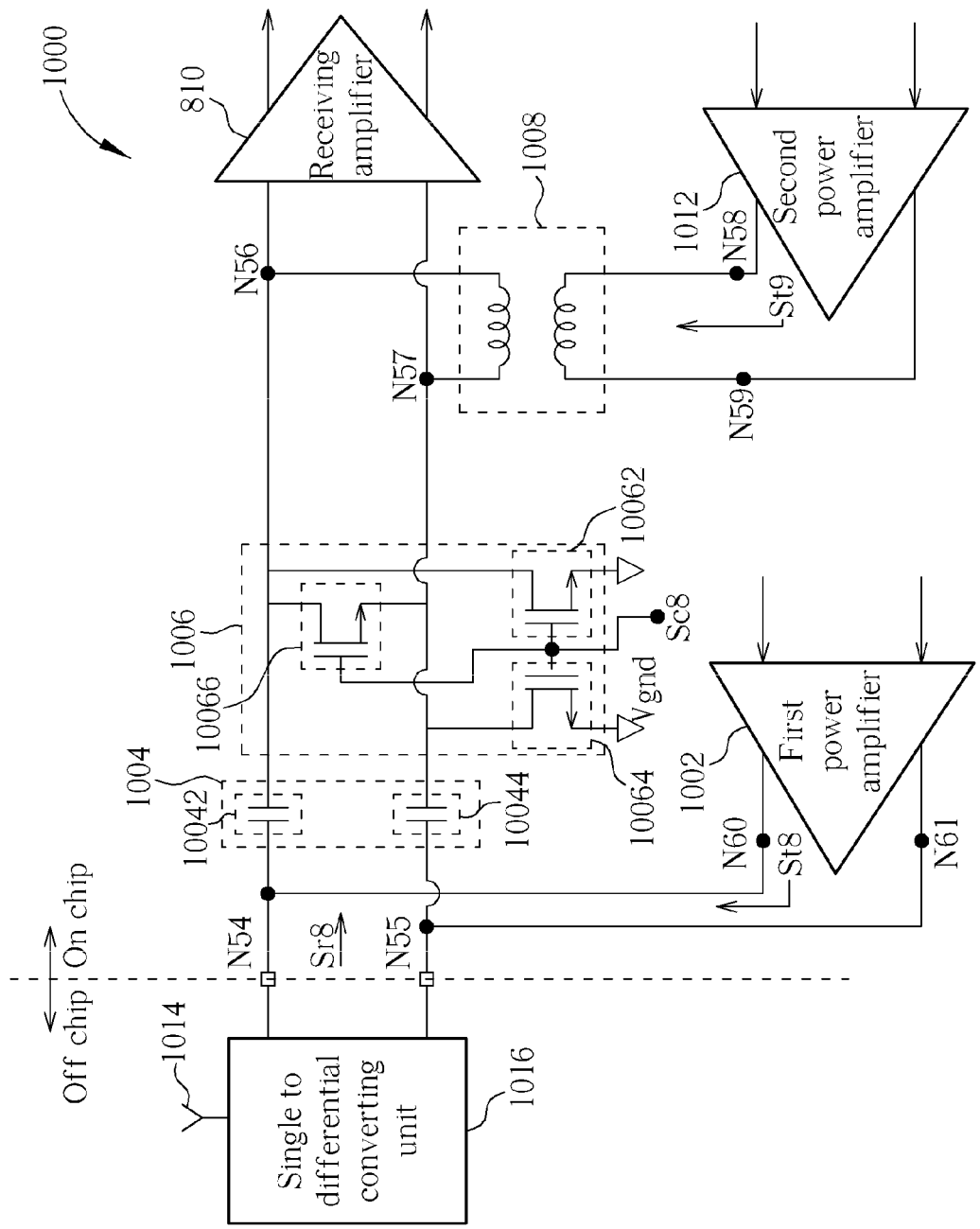
FIG. 10 is a diagram illustrating a signal transceiver according to an eighth embodiment of the present invention.

Please refer to FIG. 10, which is a diagram illustrating a signal transceiver 1000 according to an eighth embodiment of the present invention, in which the signal transceiver 1000 is a differential signal transceiver although this is not a limitation of the present invention. The signal transceiver 1000 comprises a first power amplifier 1002, a capacitive circuit 1004, a switching circuit 1006, an impedance transforming circuit 1008, a receiving amplifier 1010, a second power amplifier 1012, an antenna 1014, and a single to differential converting unit 1016. The receiving amplifier 1010 may be a low-noise amplifier (LNA). The first power amplifier 1002, the capacitive circuit 1004, the switching circuit 1006, the impedance transforming circuit 1008, the receiving amplifier 1010, and the second power amplifier 1012 are all disposed in a chip. The antenna 1014 and the single to differential converting unit 1016 are externally coupled to the chip. In this exemplary embodiment, the first power amplifier 1002 and the capacitive circuit 1004 are coupled to the single to differential converting unit 1016 via the chip output port comprising a first node N54 and a second node N55. The first power amplifier 1002 and the capacitive circuit 1004 are directly connected to the first node N54 and the second node N55.

The capacitive circuit 1004 is coupled between the chip output port (N54, N55) and a first port (N56, N57) of the impedance transforming circuit 1008. The switching circuit 1006 is arranged to selectively couple the first node N56 and the second node N57 of the first port to a reference voltage, e.g. a ground voltage Vgnd. The second power amplifier 1012 is coupled to a second port (N58, N59) of the impedance transforming circuit 1008. The receiving amplifier 1010 is coupled to the first port (N56, N57) of the impedance transforming circuit 1008.

The single to differential converting unit 1016 is coupled between the chip output port (N54, N55) and the antenna 1014 as shown in FIG. 10. The impedance transforming circuit 1008 may be a transformer.

The differential output terminals (a first output terminal N60 and a second output terminal N61) of the first power amplifier 1002 are directly connected to the chip output port (N54, N55) respectively. The capacitive circuit 1004 comprises a first capacitor 10042 and a second capacitor 10044. The first capacitor 10042 has a first terminal coupled to the first node N54 and a second terminal coupled to the first node N56. The second capacitor 10044 has a first terminal coupled to the second node N55 and a second terminal coupled to the second node N57.

The switching circuit 1006 comprises a first switch 10062, a second switch 10064, and a third switch 10066. The first switch 10062 has a first connecting terminal coupled to the first node N56, a second connecting terminal coupled to a reference voltage, e.g. the ground voltage Vgnd, and a control terminal coupled to a control signal Sc8. The second switch 10064 has a first connecting terminal coupled to the second node N57, a second connecting terminal coupled to the reference voltage, and a control terminal coupled to the control signal Sc8. The third switch 10066 has a first connecting terminal coupled to the first node N56, a second connecting terminal coupled to the second node N57, and a control terminal coupled to the control signal Sc8.

The signal transceiver 1000 may be a front end circuit of a first wireless communication system and a second wireless communication system corresponding to a first communication standard and a second communication standard respectively, wherein the first communication standard is different from the second communication standard. When the signal transceiver 1000 operates under a first transmitting mode corresponding to the first communication standard, the first power amplifier 1002 is arranged to generate a first transmitting signal St8 to the chip output port, and the control signal Sc8 turns on (i.e. closes) the first switch 10062, the second switch 10064, and the third switch 10066 to stop the first transmitting signal St8 from arriving at the receiving amplifier. The second power amplifier 1012 is disabled at this time. When the signal transceiver 1000 operates under the first transmitting mode, the voltage level of the second terminal (N56) of the first capacitor 10042 equals the second terminal (N57) of the second capacitor 10044, and the second terminal (N56) of the first capacitor 10042 and the second terminal (N57) of the second capacitor 10044 are further coupled to the ground voltage Vgnd. Therefore, if the first switch 10062, the second switch 10064, and the third switch 10066 are implemented as N-type field-effect transistors, the large swings of the first transmitting signal St8 will not affect the on state of the first switch 10062 and the second switch 10064 since the first node N56 and the second node N57 are coupled to the ground voltage Vgnd during the first transmitting mode. It should be noted that the third switch 10066 is an optional switch for the signal transceiver 1000.

When the signal transceiver 1000 operates under a second transmitting mode corresponding to the second communication standard, the second power amplifier 1012 is arranged to generate a second transmitting signal St9 to the impedance transforming circuit 1008, and the control signal Sc8 turns off (i.e. opens) the first switch 10062, the second switch 10064, and the third switch 10066 to let the second transmitting signal St9 be transmitted to the chip output port. The first power amplifier 1002 is disabled at this time, and the receiving amplifier 1010 is disabled or disconnected from the second power amplifier 1012.

When the signal transceiver 1000 operates under a receiving mode, the control signal Sc8 turns off (i.e. opens) the first switch 10062, the second switch 10064, and the third switch 10066 to pass a receiving signal Sr8 received at the chip output port (N54, N55) to the input port (N56, N57) of the receiving amplifier 1010, and the first power amplifier 802 and the second power amplifier 812 are disabled. It is noted that the receiving amplifier 1010 is a shared receiving amplifier of the communication system corresponding to the first power amplifier 1002 and the communication system corresponding to the second power amplifier 1012.

Since no physical series switch is installed on the path between the first power amplifier 1002 and the chip output port, the path loss of the first power amplifier 1002 is minimized. Because there is no physical switch on the signal path, the linearity of the first power amplifier 1002 is therefore better in comparison to the conventional counterpart when the signal transceiver 1000 operates under the first transmitting mode. In addition, according to the arrangement of the signal transceiver 1000, the output power of the second transmitting signal St9 generated by the second power amplifier 1012 may be smaller than the output power of first transmitting signal St8 generated by the first power amplifier 1002.

The above embodiments arrange an on-chip power amplifier to directly couple to the chip output port instead of installing a switch between the on-chip power amplifier and the chip output port for increasing the linearity of the on-chip power amplifier. The above embodiments also arrange an on-chip impedance transforming circuit in front of an on-chip low-noise amplifier to decrease the noise figure of the on-chip low-noise amplifier.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal transceiver, comprising:
a first amplifier, coupled to a chip output port of a chip, wherein no physical switch is installed on a path between the first amplifier and the chip output port of the chip;
an impedance transforming circuit;
a switching circuit, arranged to selectively couple the chip output port to a first port of the impedance transforming circuit; and
a second amplifier, coupled to a second port of the impedance transforming circuit.

2. The signal transceiver of claim 1, wherein the first amplifier, the impedance transforming circuit, the switching circuit, and the second amplifier are all disposed in the chip.

3. The signal transceiver of claim 1, wherein the chip output port is coupled to an antenna.

4. The signal transceiver of claim 1, wherein the impedance transforming circuit is a transformer.

5. The signal transceiver of claim 1, wherein the switching circuit is directly connected to the chip output port.

6. The signal transceiver of claim 5, wherein the first amplifier is a first power amplifier, and the switching circuit comprises:
a switch, having a first connecting terminal directly connected to the chip output port, a second connecting terminal coupled to the first port of the impedance transforming circuit, and a control terminal arranged for receiving a control signal;
wherein when the signal transceiver operates under a receiving mode, the control signal turns on the switch to pass a receiving signal received at the chip output port to the first port of the impedance transforming circuit, and the first power amplifier is disabled; and when the signal transceiver operates under a transmitting mode, the first power amplifier is arranged to generate a transmitting signal to the chip output port, and the control signal turns off the switch to stop the transmitting signal from arriving at the first port of the impedance transforming circuit.

7. The signal transceiver of claim 1, wherein the first amplifier is a first power amplifier, the second amplifier is a receiving amplifier, and the signal transceiver further comprises:
a second power amplifier, directly connected to the second port of the impedance transforming circuit.

8. The signal transceiver of claim 7, wherein the first power amplifier and the second power amplifier correspond to two different communication standards.

9. The signal transceiver of claim 7, wherein when the signal transceiver operates under a transmitting mode, only one of the first power amplifier and the second power amplifier is allowed to generate a transmitting signal to the chip output port.

10. The signal transceiver of claim 7, wherein when the second power amplifier is arranged to generate the transmitting signal to the second port of the impedance transforming circuit, the receiving amplifier is disabled.

11. The signal transceiver of claim 7, wherein the receiving amplifier is shared by one communication system corresponding to the first power amplifier and another communication system corresponding to the second power amplifier.

12. The signal transceiver of claim 1, wherein the first amplifier is a first power amplifier, the second amplifier is a second power amplifier, and the signal transceiver further comprises:
a receiving amplifier, directly connected to the first port of the impedance transforming circuit.

13. The signal transceiver of claim 12, wherein the first power amplifier and the second power amplifier correspond to two different communication standards.

14. The signal transceiver of claim 12, wherein when the signal transceiver operates under a transmitting mode, only one of the first power amplifier and the second power amplifier is allowed to generate a transmitting signal to the chip output port.

15. The signal transceiver of claim 12, wherein when the second power amplifier is arranged to generate the transmitting signal to the second port of the impedance transforming circuit, the receiving amplifier is disabled.

16. The signal transceiver of claim 12, wherein the receiving amplifier is shared by one communication system corresponding to the first power amplifier and another communication system corresponding to the second power amplifier.

17. The signal transceiver of claim 1, wherein the first amplifier is a first power amplifier, and the first power amplifier is directly connected to the chip output port or coupled to the chip output port via a single to differential converting unit.

18. A signal transceiver, comprising:
a first amplifier, coupled to a chip output port of a chip;
an impedance transforming circuit
a switching circuit, arranged to selectively couple the chip output port to a first port of the impedance transforming circuit; and
a second amplifier, coupled to a second port of the impedance transforming circuit;
wherein impedance transforming circuit comprises:
an inductor; and
a capacitor, coupled to the inductor in parallel;
wherein a first terminal and a second terminal of the inductor are the first port of the impedance transforming circuit, and a first terminal and a second terminal of the capacitor are the second port of the impedance transforming circuit.

19. A signal transceiver, comprising:
a first power amplifier, coupled to a chip output port of a chip;
an impedance transforming circuit
a switching circuit, arranged to selectively couple the chip output port to a first port of the impedance transforming circuit
a second amplifier, coupled to a second port of the impedance transforming circuit; and
a capacitive circuit, coupled between the chip output port and the switching circuit.

20. The signal transceiver of claim 19, wherein the chip output port comprises a first node and a second node directly connected to a first output terminal and a second output terminal of the first power amplifier respectively, the switching circuit comprises a first switch having a first connecting terminal coupled to a first terminal of the first port and a second switch having a first connecting terminal coupled to a second terminal of the first port, and the capacitive circuit comprises:
a third switch;
a first capacitor, having a first terminal coupled to a second connecting terminal of the first switch and a second terminal coupled to a first connecting terminal of the third switch; and
a second capacitor, having a first terminal coupled to a second connecting terminal of the second switch and a second terminal coupled to a second connecting terminal of the third switch.

21. The signal transceiver of claim 19, wherein the chip output port comprises a first node and a second node directly connected to a first output terminal and a second output terminal of the first power amplifier respectively, and the switching circuit comprises:
a first switch, having a first connecting terminal coupled to a first terminal of the first port and a second connecting terminal coupled to a reference voltage;
a second switch, having a first connecting terminal coupled to a second terminal of the first port and a second connecting terminal coupled to the reference voltage; and
a third switch, having a first connecting terminal coupled to the first terminal of the first port and a second connecting terminal coupled to the second terminal of the first port.

22. The signal transceiver of claim 19, wherein the chip output port comprises a first node and a second node directly connected to a first output terminal and a second output terminal of the first power amplifier respectively, and the capacitive circuit comprises:
a first capacitor, having a first terminal coupled to the first node and a second terminal coupled to a first terminal of the first port; and
a second capacitor, having a first terminal coupled to the second node and a second terminal coupled to a second terminal of the first port.

23. The signal transceiver of claim 22, wherein the switching circuit comprises:
a first switch, having a first connecting terminal coupled to the second terminal of the first capacitor, and a second connecting terminal coupled to the first terminal of the first port; and
a second switch, having a first connecting terminal coupled to the second terminal of the second capacitor, and a second connecting terminal coupled to the second terminal of the first port.

* * * * *